US012754476B2

(12) United States Patent
Li et al.

(10) Patent No.: US 12,754,476 B2
(45) Date of Patent: Oct. 6, 2026

(54) COLOR-RESIST COMPOSITIONS AND DISPLAY PANELS

(71) Applicants: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

(72) Inventors: Ji Li, Huizhou (CN); Xia Zhang, Huizhou (CN)

(73) Assignees: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 562 days.

(21) Appl. No.: 18/278,190

(22) PCT Filed: Jun. 13, 2023

(86) PCT No.: PCT/CN2023/099789

§ 371 (c)(1),
(2) Date: Aug. 22, 2023

(87) PCT Pub. No.: WO2024/234431

PCT Pub. Date: Nov. 21, 2024

(65) Prior Publication Data

US 2025/0036025 A1 Jan. 30, 2025

(30) Foreign Application Priority Data

May 18, 2023 (CN) ......................... 202310566564.0

(51) Int. Cl.
*G03F 7/028* (2006.01)
*G02F 1/1335* (2006.01)
*G03F 7/00* (2006.01)

(52) U.S. Cl.
CPC ........ *G03F 7/028* (2013.01); *G02F 1/133516* (2013.01); *G03F 7/0007* (2013.01)

(58) Field of Classification Search
CPC ................................. G03F 7/027; G03F 7/028
See application file for complete search history.

(56) References Cited

U.S. PATENT DOCUMENTS 10,759,960 B2 * 9/2020 Jingu ................. C08G 18/6225

FOREIGN PATENT DOCUMENTS

CN 102789020 A 11/2012
CN 103370642 A 10/2013
(Continued)

OTHER PUBLICATIONS

PCT International Search Report for International Application No. PCT/CN2023/099789, mailed on Feb. 3, 2024, 7pp.
(Continued)

*Primary Examiner* — Amanda C. Walke
(74) *Attorney, Agent, or Firm* — The Roy Gross Law Firm, LLC; Roy D. Gross

(57) ABSTRACT

Embodiments of the present disclosure provide a color-resist composition and a display panel, and the color-resist composition includes a photocurable resin and a photosensitive monomer. The photosensitive monomer has a chemical structure provided by the embodiments of the present disclosure. The photocurable resin is correspondingly selected from the photocurable resin in the embodiments of the present disclosure. The crosslinking degree of the photocurable resin can be enhanced by adding the photosensitive monomer to the photocurable resin during a preparation
(Continued)

process to form a color-resist film layer, which improves the overall performance of the display panel.

20 Claims, 2 Drawing Sheets

(56) References Cited

FOREIGN PATENT DOCUMENTS

| | | | | | |
|---|---|---|---|---|---|
| CN | 107608179 A | | 1/2018 | | |
| CN | 109100918 A | | 12/2018 | | |
| KR | 20090092697 A | | 9/2009 | | |
| KR | 20160112367 A | * | 9/2016 | ........... | G03F 7/0045 |

OTHER PUBLICATIONS

PCT Written Opinion of the International Searching Authority for International Application No. PCT/CN2023/099789, mailed on Feb. 3, 2024, 9pp.

* cited by examiner

| | Thickness (μm) | Dielectric constantε | Frequency (Hz) | Hardness (B) | Film-breaking time (s) | Inclination angle (degrees) | Chromatic aberration grade |
|---|---|---|---|---|---|---|---|
| Resin 1 | 2.58 | 3.95 | 10 | 8 | 45 | 45 | 1 |
| Resin 2 | 2.64 | 3.78 | 10 | 8 | 30 | 42 | 1 |
| Resin 3 | 2.61 | 3.85 | 10 | 7.5 | 34 | 47 | 1 |
| Comparison group | 2.54 | 4.14 | 10 | 4.3 | 101 | 68 | 1 |

COLOR-RESIST COMPOSITIONS AND DISPLAY PANELS

CROSS REFERENCE TO RELATED APPLICATIONS

This application is a national Stage of International Application No. PCT/CN2023/099789, filed on Jun. 13, 2023, which claims priority to and the benefit of Chinese Patent Application No. 202310566564.0, filed on May 18, 2023. The disclosures of the aforementioned applications are incorporated herein by reference in their entireties.

TECHNICAL FIELD

The disclosure relates to the field of design and manufacturing for display panels, in particular to color-resist compositions and display panels.

BACKGROUND

With the development of the preparation technology for display panels, people have higher requirements on the display effect and overall performance of the display panels and display devices.

When a display panel emits light and displays normally, light inside the display panel passes through a color-resist layer to realize display effects of different colors. For example, when light passes through a red color-resist, a blue color-resist, and a green color-resist, different colors of light can be obtained to meet user's needs. Therefore, the performance and characteristics of the color-resist layer have an important influence on the display effect of the display panel. In the related art, during the preparation process to form the color-resist layer, such as the preparation process to form a red color-resist, a blue color-resist, and a green color-resist, a fixed pattern structure can be formed by a typical yellow light process including coating, exposing to light, developing, and post-baking processes. During the process of exposing to light, the part that is exposed to light generates active free radicals under the irradiation of ultraviolet light due to the action of a photoinitiator, arising crosslinking reaction, and finally forming a network structure corresponding to different color-resist patterns. However, during the formation process of the above-mentioned different color-resist patterns, when exposing to light, due to the soft or hard characteristic of the color-resist itself, in the process of curing, the edge of the color-resist generally has an unsatisfactory inclination angle, for example, the inclination angle may be too large or too small. If the inclination angle is too large, a steeper chamfer pattern is formed, which leads to the problem of light leakage; if the inclination angle is too small, the edge of the color-resist has a long trail, which is prone to arise the problem of display chromatic aberration. Therefore, when the color-resist pattern structure is prepared by using the color-resist material in the related art, the obtained color-resist has an unsatisfactory inclination angle at the edge, resulting in the unsatisfactory performance of the color-resist, which is not conducive to further improvement of the display effect and overall performance of the display panel.

Therefore, it is necessary to propose a solution to solve the above-mentioned problems in the related art.

Technical Problems

Based on the above, during the preparation process to form a color-resist using materials provided by the related art, the obtained color-resist pattern has an unsatisfactory inclination angle at the edge, resulting in unsatisfactory performance of the color-resist, which is not conducive to further improvement of the overall performance of display panels.

Technical Solutions

In order to solve the above-mentioned problems, embodiments of the present disclosure provide a color-resist composition and a display panel, which effectively improves the performance of the color-resist and an unsatisfactory inclination angle of the color-resist at the edge when a color-resist material in the related art is used to prepare the color-resist, thus effectively improving the display effect of the display panel.

In order to solve the above-mentioned technical problems, the embodiments of the present disclosure provide a color-resist composition, including:

a photocurable resin; and a photosensitive monomer;

in which the photosensitive monomer is represented by the following chemical structure:

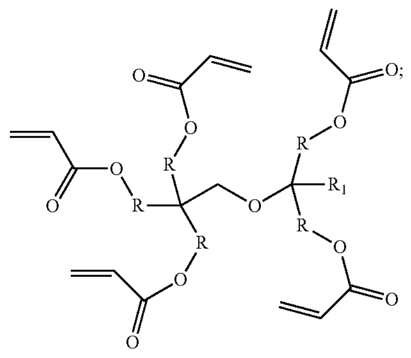

in which R is an alkyl group containing any one of an ether group, —OH, and —COOH, and $R_1$ is selected from any one of —OH, —COOH, and an alkyl group containing any one of —OH and —COOH; a relative molecular mass of the photosensitive monomer ranges from 500 to 1200, and the photosensitive monomer is a vinyl unsaturated double bond photosensitive monomer containing —COOH.

According to an embodiment of the present disclosure, a ratio of a mass percentage of the photocurable resin to a mass percentage of the photosensitive monomer may be set ranging from 0.3 to 0.7.

According to an embodiment of the present disclosure, a relative molecular mass of the photocurable resin may be set ranging from 8000 to 12000, and an acid value of the photocurable resin may range from 80 to 120.

According to an embodiment of the present disclosure, the photocurable resin may include at least a first photocurable resin; and the first photocurable resin may be a photocurable resin containing a carbon-carbon double bond.

According to an embodiment of the present disclosure, the photocurable resin may include a second photocurable resin, and the second photocurable resin may have a structure represented by at least one of the following chemical structures:

(AA)
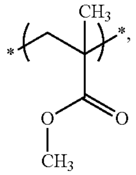
(AB)
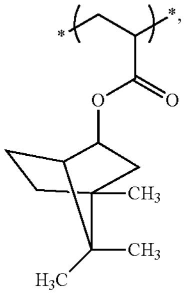
(AC)
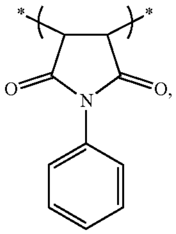
(AD)
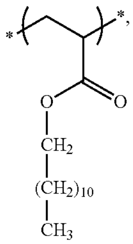
and
(AF)
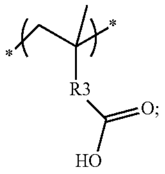
the first photocurable resin may have a structure represented by at least one of the following chemical structures:
(AE)
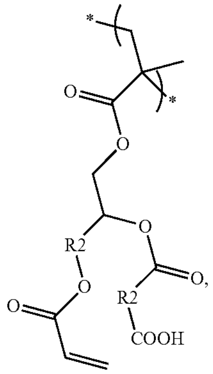
(AG)
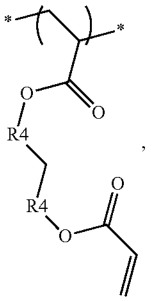
(AH)
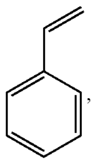
(AI)
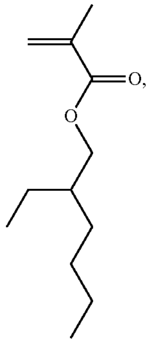
(AJ)
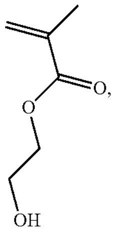

-continued (AK)

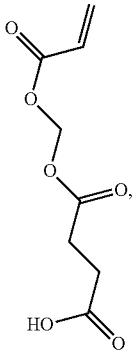

and (AL)

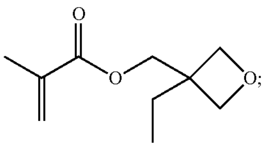

and in which R2, R3, and R4 may be carbon chains.

According to an embodiment of the present disclosure, a content of the first photocurable resin may be greater than a content of the second photocurable resin, calculated by a mass percentage of the first photocurable resin and a mass percentage of the second photocurable resin in the color-resist composition, respectively.

According to an embodiment of the present disclosure, the photocurable resin may be set as follows:

a combination of components of AE, AF, and AG, in which the components and mass percentages thereof may be correspondingly as follows: AE:AF:AG=25:45:30; or a combination of components of AH, AC, AI, AJ, AF, and AK, in which the components and mass percentages thereof may be correspondingly as follows: AH:AC:AI:AJ:AF:AK=10:15:40:15:10:10; or a combination of components of AH, AC, AI, AJ, AL, and AF, wherein the components and mass percentages thereof may be correspondingly as follows: AH:AC:AI:AJ:AL:AF=10:15:20:15:25:15.

According to an embodiment of the present disclosure, the photosensitive monomer may contain a hydrophilic group, and the relative molecular mass of the photosensitive monomer may be set ranging from 500 to 1200.

According to a second aspect of the embodiments of the present disclosure, another color-resist composition is further provided, including:

a photocurable resin; and a photosensitive monomer;

in which the photosensitive monomer is represented by the following chemical structure:

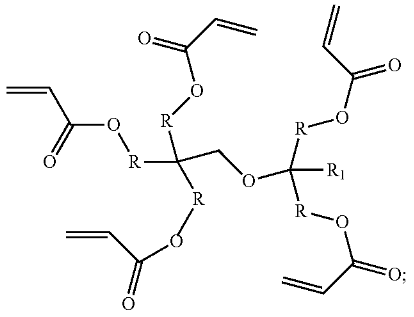

in which R is an alkyl group containing any one of an ether group, —OH, and —COOH, $R_1$ is selected from any one of —OH, —COOH, and an alkyl group containing any one of —OH and —COOH.

According to an embodiment of the present disclosure, a ratio of a mass percentage of the photocurable resin to a mass percentage of the photosensitive monomer may be set ranging from 0.3 to 0.7.

According to an embodiment of the present disclosure, a relative molecular mass of the photocurable resin may be set ranging from 8000 to 12000, and an acid value of the photocurable resin may range from 80 to 120.

According to an embodiment of the present disclosure, the photocurable resin may include at least a first photocurable resin; and the first photocurable resin may be a photocurable resin containing a carbon-carbon double bond.

According to an embodiment of the present disclosure, the photocurable resin may include a second photocurable resin, and the second photocurable resin may have a structure represented by at least one of the following chemical structures:

(AA)

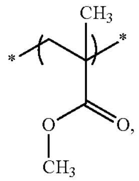

(AB)

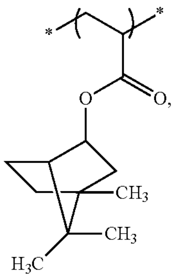

(AC)

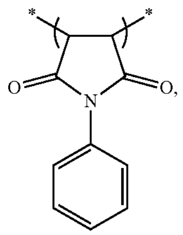

-continued (AD)

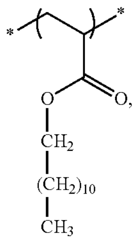

and (AF)

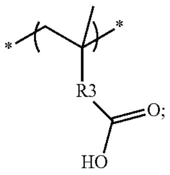

the first photocurable resin may have a structure represented by at least one of the following chemical structures:

(AE)

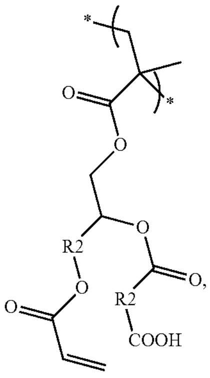

(AG)

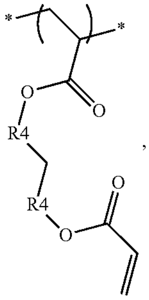

, (AH)

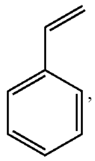

,

-continued (AI)

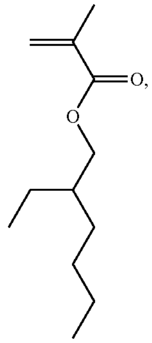

(AJ)

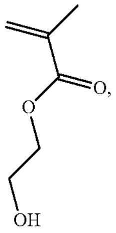

(AK)

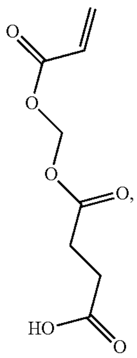

and (AL)

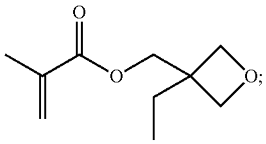

and in which R2, R3, and R4 may be carbon chains.

According to an embodiment of the present disclosure, a content of the first photocurable resin may be greater than a content of the second photocurable resin, calculated by a mass percentage of the first photocurable resin and a mass percentage of the second photocurable resin in the color-resist composition, respectively.

According to an embodiment of the present disclosure, the photocurable resin may be set as follows:

a combination of components of AE, AF, and AG, wherein the components and mass percentages thereof are correspondingly as follows: AE:AF:AG=25:45:30; or a combination of components of AH, AC, AI, AJ, AF, and AK, wherein the components and mass percentages thereof are correspondingly as follows: AH:AC:AI:AJ:AF:AK=10:15:40:15:10:10; or a combination of components of AH, AC, AI, AJ, AL, and AF, wherein the components and mass percentages thereof are correspondingly as follows: AH:AC:AI:AJ:AL:AF=10:15:20:15:25:15.

According to an embodiment of the present disclosure, the photosensitive monomer may contain a hydrophilic group, and the relative molecular mass of the photosensitive monomer may be set ranging from 500 to 1200.

According to a third aspect of the embodiments of the present disclosure, a display panel is further provided, including:

a liquid crystal layer; and a color-resist layer disposed on a light-emitting side of the liquid crystal layer;

in which a material of the color-resist layer is a color-resist composition, and the color-resist composition includes:

a photocurable resin; and a photosensitive monomer;

in which the photosensitive monomer is represented by the following chemical structure:

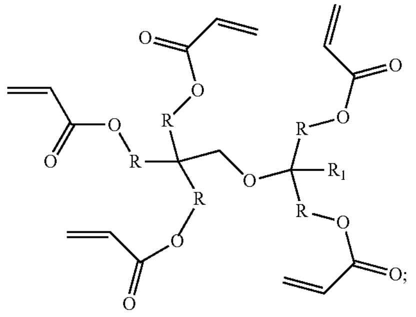

in which R is an alkyl group containing any one of an ether group, —OH, and —COOH, $R_1$ is selected from any one of —OH, —COOH, and an alkyl group containing any one of —OH and —COOH.

According to an embodiment of the present disclosure, the color-resist layer may include a plurality of color-resist blocks, an inclination angle may be formed between a side surface of each of the color-resist blocks and a substrate, and the inclination angle may be set ranging from 40 degrees to 60 degrees.

According to an embodiment of the present disclosure, the photosensitive monomer contains a hydrophilic group, and a relative molecular mass of the photosensitive monomer may be set ranging from 500 to 1200.

According to an embodiment of the present disclosure, a relative molecular mass of the photocurable resin may be set ranging from 8000 to 12000, and an acid value of the photocurable resin may range from 80 to 120.

Beneficial Effects

In view of foregoing, beneficial effects of embodiments of the present disclosure are as follows:

the embodiments of the present disclosure provide a color-resist composition and a display panel, and the color-resist composition includes a photocurable resin and a photosensitive monomer. The photosensitive monomer has a chemical structure provided by the embodiments of the present disclosure. The photocurable resin is correspondingly selected from the photocurable resins in the embodiments of the present disclosure. In the embodiments of the present disclosure, the crosslinking degree of the photocurable resin can be enhanced by adding the photosensitive monomer to the photocurable resin during a preparation process to form a color-resist film layer, which effectively improves the hardness of the color-resist film layer prepared by the color-resist composition and the inclination angle of the color-resist film layer at the edge, thus effectively improving the display effect of the display panel using the color-resist film layer and the overall performance of the display panel.

DETAILED DESCRIPTION OF EMBODIMENTS

Figure 1:
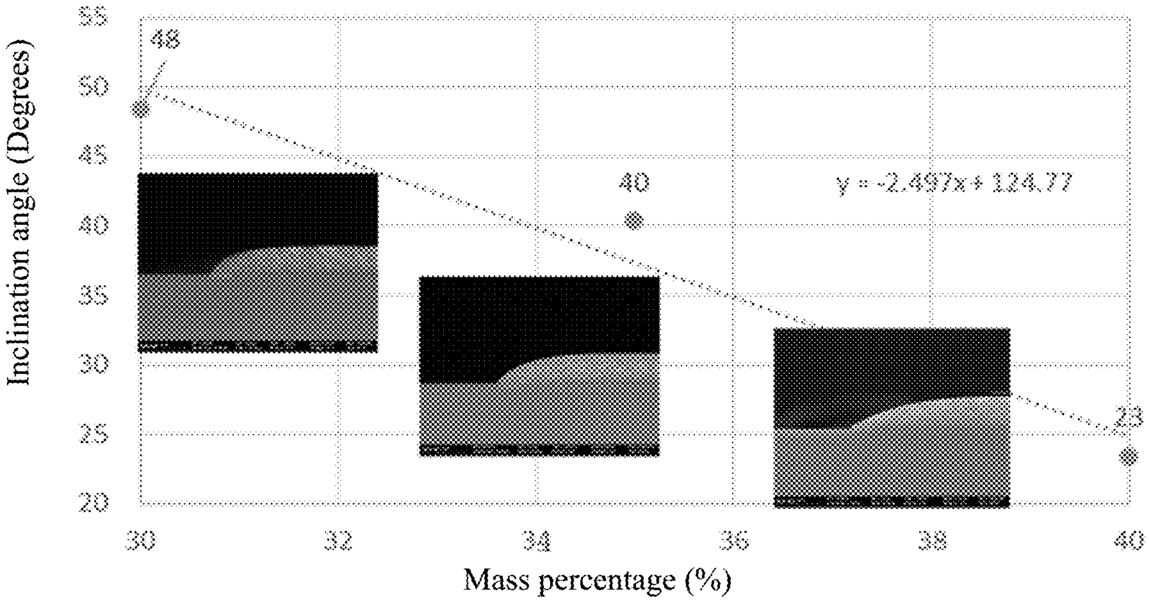
FIG. 1 is a corresponding relationship of a photocurable resin and a photosensitive monomer at different mass percentages according to some embodiments of the present disclosure.

The following descriptions of the various embodiments refer to the attached drawings to illustrate specific embodiments in which the present disclosure can be implemented.

With continuous development of the preparation technology for display panels, people have higher requirements on the display effect and the overall performance of the display panels and display devices.

A color-resist film layer with different colors of color-resists are usually disposed in the display panel, and the color display effect of the display panel is realized through the color-resist film layer. However, during the preparation process of the color-resist film layer in the related art, due to the characteristics and performance of materials for preparing the color-resist film layer, the performance of the prepared color-resist film layer is unsatisfactory. For example, an inclination angle of the color-resist film layer at the edge is unsatisfactory, which easily leads to light leakage or unsatisfactory display effect in the region where the inclination angle is formed, and is not conducive to further improvement of the overall performance of the display panel.

The embodiments of the present disclosure provide a color-resist composition, a color-resist film layer prepared by using the color-resist composition, and a display panel, so as to effectively improve the performance of the color-resist film layer and the overall performance of the display panel.

Specifically, an embodiment of the present disclosure provides a color-resist composition, which includes a photocurable resin and a photosensitive monomer.

The photosensitive monomer is represented by the following chemical structure:

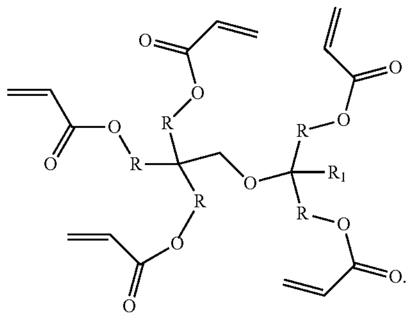

In the above-mentioned chemical structure, R is an alkyl group containing any one of an ether group, —OH, and —COOH; $R_1$ is any one of —OH and —COOH, or, $R_1$ is an alkyl group containing any one of —OH and —COOH. Further, when designing the above-mentioned chemical structure, the alkyl group corresponding to R contains at least one of the groups provided above. Similarly, the alkyl group corresponding to $R_1$ can only contain any one of the above-mentioned groups, or contain at least two of the above-mentioned groups, which will not be repeated here. In the description of the following embodiments, the alkyl group containing one of the above-mentioned groups is taken for an example for illustration.

During the preparation process to form the above-mentioned color-resist composition, the photocurable resin and the photosensitive monomer are mixed according to a prescribed proportion. When proportions of the photocurable resin and the photosensitive monomer are different, cross-linking degrees of the compositions with different contents of the photocurable resin and the photosensitive monomer are different during the preparation process, and the hardness of the prepared color-resist film layers are different after the crosslinking. When the hardness of the color-resist film layer is small, the edge of the color-resist film layer is prone to collapse, which easily leads to an unsatisfactory inclination angle of the color-resist film layer at the edge, thus reducing the display effect of the display panel.

In the embodiments of the present disclosure, in order to prepare the color-resist film layer with better hardness and overall performance, a ratio P/M of a mass percentage of the photocurable resin (P) to a mass percentage of the photosensitive monomer (M) is set ranging from 0.3 to 0.7.

Further, as shown in FIG. 1, FIG. 1 is a corresponding relationship of the photocurable resin and the photosensitive monomer at different mass percentages according to the embodiments of the present disclosure. In FIG. 1, below the relationship line are scanning electron microscope pictures of the color-resist layers prepared by the color-resist compositions with different proportions. Specifically, when the photocurable resin and the photosensitive monomer have different mass percentages, the final prepared color-resist layers have different inclination angles at the edge.

The ratios of mass percentages of the photocurable resins to mass percentages of the photosensitive monomers corresponding to scanning electron microscope pictures of three color-resist layers are 0.3, 0.35, and 0.4, respectively, and the inclination angles of the color-resist layers corresponding to the above-mentioned ratios are 48 degrees, 40 degrees, and 23 degrees, respectively. A relational equation of the inclination angles and the ratios of the compositions can be obtained through the above-mentioned data, which are as follows: $y=-2.497x+124.77$, in which y represents the inclination angle, and x represents the ratio of the mass percentage of the photocurable resin to the mass percentage of the photosensitive monomer. In addition, it has been verified through multiple experiments that they all conform to the above-mentioned relational equation.

In the embodiments of the present disclosure, in the above-mentioned relational equation, in order to ensure the inclination angles at the edge, optionally, a content of the photocurable resin is 40 parts, a content of the photosensitive monomer is 60 parts, and the ratio of the mass percentage of the photocurable resin to the mass percentage of the photosensitive monomer is 0.67; or, the content of the photocurable resin is 35 parts, the content of the photosensitive monomer is 65 parts, and the ratio of the content of the photocurable resin to the content of the photosensitive monomer is 0.53; or, the content of the photocurable resin and the content of the photosensitive monomer can be set according to the requirements of different products to obtain the compositions with different contents of components.

Further, in the color-resist composition of the embodiments of the present disclosure, a relative molecular mass of the photocurable resin is set ranging from 8000 to 12000, and an acid value of the photocurable resin is set ranging from 80 to 120. Optionally, the relative molecular mass of the photocurable resin is set as 9000 or 10000, or it can be set according to the performances of different color-resist film layers. Optionally, the acid value of the photocurable resin can be set as 90, 95, or 115, or it can be set according to the performances of specific products, which will not be repeated here.

In the embodiments of the present disclosure, a relative molecular mass of the photosensitive monomer ranges from 500 to 1200, and the photosensitive monomer may contain a functional group such as an ether group, a hydroxyl group, a carboxyl group, and the like. Optionally, the above-mentioned functional groups are hydrophilic groups, and the number of the hydrophilic groups may be five or six. In the embodiments of the present disclosure, the photosensitive monomer containing five carboxyl groups are taken for an example for illustration. Specifically, for example, the photosensitive monomer contain the carboxyl groups, which has a chemical structure represented by the above-mentioned structure.

Meanwhile, when setting the color-resist composition, the photocurable resin is a photocurable resin at least containing a carbon-carbon double bond. Optionally, the photocurable resin may include a first photocurable resin and a second photocurable resin. The first photocurable resin is a photocurable resin containing the carbon-carbon double bond.

In the embodiments of the present disclosure, when setting the photocurable resin, the second photocurable resin may have a structure represented by at least one of the following chemical structures:

(AA)

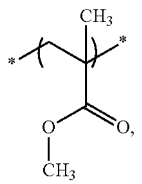

-continued (AB)

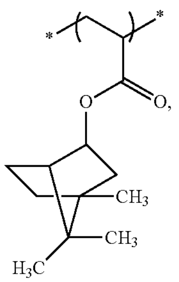

, (AC)

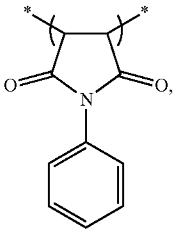

, (AD)

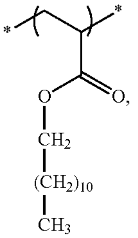

, and (AF)

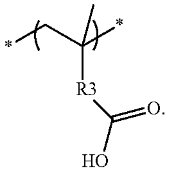

.

In the above-mentioned chemical structures, the symbol below the corresponding chemical structure is the type of resin. That is, the second photocurable resins are AA, AB, AC, AD, and AF.

Further, in the embodiments of the present disclosure, the first photocurable resin may have a structure represented by at least one of the following chemical structures:

(AE)

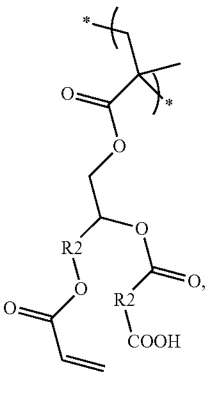

,

-continued (AG)

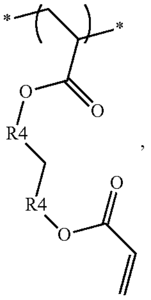

, (AH)

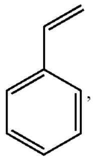

, (AI)

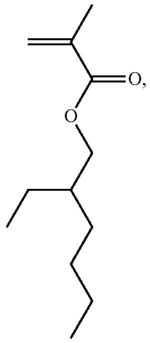

, (AJ)

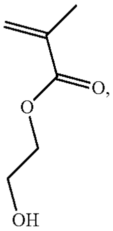

, (AK)

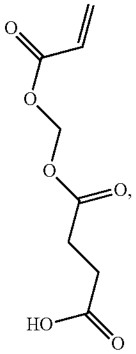

, and (AL)

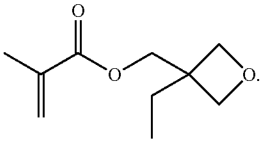

.

$R_2$ in AE and $R_1$ in AG corresponding to the first photocurable resins, and R3 in AF corresponding to the second photocurable resin, are carbon chains. Specifically, lengths of the above-mentioned carbon chains can be set to the same or different. When setting the carbon chains, it should be ensured that the corresponding resin meets other limitations and requirements in the embodiments of the present disclosure, which is not specifically limited here.

In the embodiments of the present disclosure, the first photocurable resin is the photocurable resin containing an unsaturated carbon-carbon double bond. Similarly, the symbols below the chemical structures of the first photocurable resins only represent the types of the resins. That is, the first photocurable resins are AE, AG, AH, AI, AJ, AK, and AL.

During the preparation process to form the color-resist composition in the embodiments of the present disclosure, it can be prepared according to the above-mentioned second photocurable resins and first photocurable resins.

Specifically, at least one of the five different second photocurable resins and at least one of the seven different first photocurable resins are selected, and the selected second photocurable resins and first photocurable resins are mixed to obtain the photocurable resin of the embodiments of the present disclosure.

In some embodiments, because the first photocurable resins are photocurable resins containing the unsaturated carbon-carbon double bond, the photocurable resins in these embodiments of the present disclosure can be selected only from the first photocurable resins mentioned above.

In another embodiment provided by the present disclosure, at least one of the second photocurable resins and at least three different first photocurable resins are selected, so as to further improve the performances and types of the photocurable resin and obtain color-resist compositions with different performances.

Optionally, in the embodiments of the present disclosure, a content of the first photocurable resin is greater than a content of the second photocurable resin, calculated by a mass percentage of the first photocurable resin and a mass percentage of the second photocurable resin in the color-resist composition, respectively. Specifically, for example, three different resins selected from the first photocurable resins and two different resins selected from the second photocurable resins are mixed to obtain the photocurable resin, in which the content of the first photocurable resins is greater than the content of the second photocurable resins, so that the photocurable resin contains more unsaturated types of carbon-carbon double bonds, which can improve photocurable effect and performances of the photocurable resin.

In the following embodiments, during the preparation process to form the color-resist composition provided by the embodiments of the present disclosure, the photocurable resin can be set as a combination of AE, AF, and AG.

The above-mentioned photocurable resin includes one type of the second photocurable resins that is AF and two types of the first photocurable resins that are AE and AG.

When setting according to the above-mentioned combination, different types of photocurable resins and proportions thereof are correspondingly as follows: AE:AF:AG=25:45:30. A relative molecular mass of the prepared photocurable resin ranges from 8000 to 12000, and an acid value of the prepared photocurable resin ranges from 80 to 120, so as to ensure the performances of the photocurable resin.

In another aspect, another photocurable resin with different components is further provided by some embodiments of the present disclosure. Optionally, the photocurable resin can be set as follows:

a combination of AH, AC, AI, AJ, AF, and AK, and different types of photocurable resins and corresponding proportions thereof are correspondingly as follows: AH, AC, AI, AJ, AF, and AK=10:15:40:15:10:10.

Specifically, the above-mentioned photocurable resin includes two types of the second photocurable resins that are AC and AF, and four types of the first photocurable resins that are AH, AI, AJ, and AK. The different photocurable resins mentioned above are mixed to obtain the photocurable resin provided by the embodiments of the present disclosure.

Further, the embodiments of the present disclosure further provide another photocurable resin. Specifically, the photocurable resin can be set as follows:

a combination of AH, AC, AI, AJ, AL, and AF, and different types of photocurable resins and corresponding proportions thereof are correspondingly as follows: AH, AC, AI, AJ, AL, and AF=10:15:20:15:25:15.

Specifically, the above-mentioned photocurable resin includes two types of the second photocurable resins that are AC and AF, and four types of the first photocurable resins that are AH, AI, AJ, and AL. The different photocurable resins mentioned above are mixed according to a preset proportion to obtain the photocurable resin provided by the embodiments of the present disclosure.

Furthermore, in the embodiments of the present disclosure, after mixing to form the above-mentioned photocurable resin, the photosensitive monomer can be added to the photocurable resin to form the color resistance composition provided by the embodiments of the present disclosure.

During the preparation process to form the display panel, the color-resist composition is selected and treated with a yellow light process to form a color-resist pattern by coating, exposing to light, developing, and baking. During the treatment of exposing to light, the part that is not exposed to light can be dissolved in an alkaline developing solution, while the part that is exposed to light generates active free radicals under the irradiation of ultraviolet light due to the action of a photoinitiator contained in the color-resist composition, arising cross-linking reaction between the multifunctional photosensitive monomer and the photocurable resin to form a network structure that is the color-resist pattern in the embodiments of the present disclosure. The photoinitiator mentioned above can be a photoinitiator used in the art.

Figure 2:
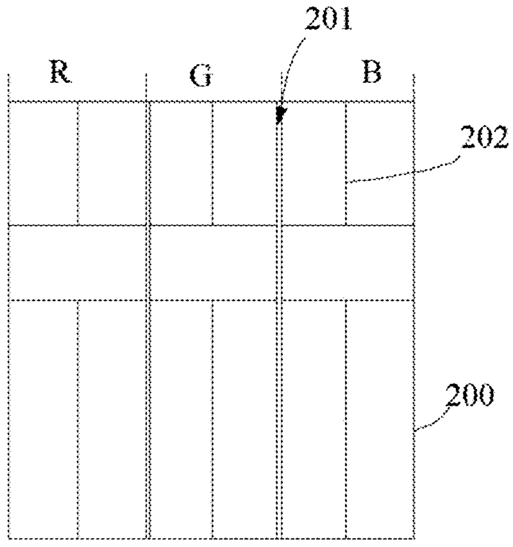
FIG. 2 is a color-resist pattern of a display panel according to some embodiments of the present disclosure.

Specifically, as shown in FIG. 2, FIG. 2 is the color-resist pattern of the display panel provided by the embodiments of the present disclosure. In the embodiments of the present disclosure, three color-resists with different colors are taken for an example for illustration.

A pixel unit 200 in the display panel that includes a red sub-pixel R, a green sub-pixel G, and a blue sub-pixel B are taken for an example. The red sub-pixel R, the green sub-pixel G, and the blue sub-pixel B can be arranged according to conventional pixel arrangement, which are sequentially arranged in a low, as shown in FIG. 1. When setting the color-resists, since the three color-resists with different colors are adjacent to each other, a lap-joint region 201 is generally set between two adjacent color-resists with different colors to prevent light leakage. In the lap-joint region 201, the two color-resists with different colors overlap with each other to a certain extent. The narrower the width of an overlapping region is, the larger the aperture ratio of the region corresponding to the display panel will be. If a narrower overlapping region is obtained, the inclination angle of the color-resist at the edge is required to be neither too gentle nor too steep.

In the embodiments of the present disclosure, by improving the composition containing color-resist materials and using the color-resist materials provided by the embodiments of the present disclosure, the inclination angle of the color-resist at the edge in the overlapping region can be set ranging from 40 degrees to 60 degrees during the preparation process to form the above-mentioned color-resist, thus ensuring the width of the overlapping region, and increasing the aperture ratio of the panel on a condition of preventing light leakage.

Optionally, the color-resist composition provided by the embodiments of the present disclosure is used to prepare the color-resist by using the conventional yellow light process, so that the inclination angle of the finally obtained color-resist in the overlapping region can be 45 degrees, 55 degrees, or 60 degrees. In addition, the width of the overlapping region corresponding to the color-resists is set ranging from 3 μm to 5 μm. Optionally, the width of the overlapping region between two adjacent sub-pixels is set as 3.5 μm or 4 μm, or set according to requirements of different products.

Figures 3, 4:
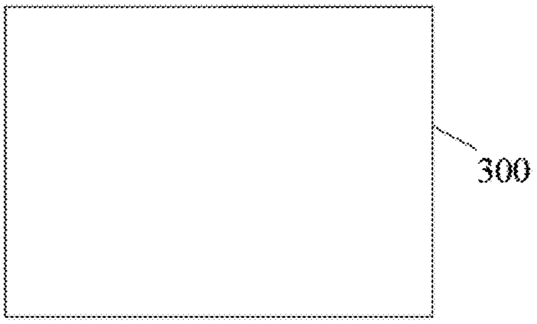
FIG. 3 illustrates parameter values of different color-resists prepared by using different color-resist compositions according to some embodiments of the present disclosure.
FIG. 4 is a schematic structural diagram of a display panel according to some embodiments of the present disclosure.

Further, as shown in FIG. 3, FIG. 3 illustrates parameter values of the color-resists prepared by the above-mentioned color-resist compositions containing different materials provided by the embodiments of the present disclosure.

In the experimental results shown in FIG. 3 above, different color-resist compositions were selected and further processed to form the color-resists provided by the embodiments of the present disclosure. The resins corresponding to the selected color-resist compositions are namely resin 1, resin 2, and resin 3, respectively. The mixed materials in the above-mentioned three different resins are different.

Specifically, components and proportions thereof in the resin 1 provided by the embodiments of the present disclosure are set as follows: AE:AF:AG=25:45:30.

Components and proportions thereof in the resin 2 provided by the embodiments of the present disclosure are set as follows: AH:AC:AI:AJ:AF:AK=10:15:40:15:10:10.

Components and proportions thereof in the resin 3 provided by the embodiments of the present disclosure are set as follows: AH:AC:AI:AJ:AL:AF=10:15:20:15:25:15.

Further, in the above-mentioned table 1, a comparison group is further provided, and the color-resist material in the comparison group is the color-resist material used in the related art, such as a commonly used resin material containing acrylic monomer. The above-mentioned different materials are respectively used to prepare the color-resist layers of the display panels. During the preparation process, the resin 1, the resin 2, and the resin 3 are respectively mixed with the photosensitive monomer provided by the embodiments of the present disclosure, and the ratio of the mass percentage of each of the above-mentioned resins to the mass percentage of each of the photosensitive monomers is 0.5.

Properties of different materials are tested, and it can be seen that, for the color-resist layers prepared using the resin 1, the resin 2, and the resin 3, the inclination angles of the color-resists in the color-resist layers at the edges are 45 degrees, 42 degrees, and 47 degrees, respectively, while the inclination angle of the color-resist prepared using commonly color-resist material is 68 degrees. Therefore, the present disclosure can effectively reduce the inclination angle of the color-resist, thus improving the performances of the color-resist layer.

Meanwhile, thicknesses of the color-resist layers prepared using the resin 1, the resin 2, and the resin 3 are 2.58 μm, 2.64 μm, and 2.61 μm, respectively, while a thickness of the color-resist layer prepared using the color-resist material in the comparison group is 2.54 μm. That is, the thicknesses of the color-resist layers prepared using the color-resist compositions containing different materials provided by the present disclosure are relatively thinner, which can realize the lightweight and thinness design of devices on a condition of ensuring the performances of the panel.

Further, the light transmission effect of the color-resist layers is tested, and it can be seen that, after light passes through the corresponding color-resist layers of the embodiments of the present disclosure, chromatic aberration grades corresponding to the color-resist layers are all 1st grades, and the chromatic aberration grade of the color-resist layer in the comparison group is also 1st grade, that is, both of the two have better light transmission effect. In the embodiments of the present disclosure, the chromatic aberration grade being 1st grade indicates that the color-resist layer has a better transmission effect on light, thus ensuring a luminous display effect of the panel.

Meanwhile, in the embodiments of the present disclosure, dielectric constants of the color-resist layers corresponding to different groups are tested, and it can be seen that all the dielectric constants of the color-resist layers prepared using the resin 1, the resin 2, and the resin 3 provided by the embodiments of the present disclosure are less than the dielectric constant of the color-resist layer in the comparison group. All the dielectric constants are tested at a frequency of 10 Hz during the testing process, so as to ensure that the color-resist layers prepared by the embodiments of the present disclosure have higher insulation property.

Further, during the preparation process to form the different color-resist layers provided by the embodiments of the present disclosure, all film-breaking times of the color-resist layers are less than 50 seconds, while the film-breaking time in the comparison group is greater than 100 seconds. Therefore, the color-resist layers in the embodiments of the present disclosure can effectively improve preparation efficiency.

The hardness test was carried out on the color-resist layers prepared using different materials. During the test process, different color-resist layers are respectively loaded with a weight of 250 g to measure corresponding hardness value. It can be seen that all the hardness values of the color-resist layers prepared by the embodiments of the present disclosure are greater than 7 B, while the hardness value in the conventional comparison group is 4.3 B. Therefore, the hardness of the color-resist layers in the embodiments of the present disclosure can be significantly improved, thus ensuring the quality and reliability of film layers.

Based on the above, according to the properties of different color-resist layers and corresponding parameter values thereof, it can be seen that the color-resist layers provided by the embodiments of the present disclosure are better than those of the comparison group in terms of quality and overall performance, thus effectively improving the overall performance of the color-resist layers and the display panels including the color-resist layers.

Further, as shown in FIG. 4, FIG. 4 is a display panel provided by the embodiments of the present disclosure. A display panel 300 includes an array substrate, a liquid crystal layer disposed on the array substrate, and a color-resist layer disposed on a light-emitting side of the liquid crystal layer. A color-resist material used in the preparation process of the color-resist layer and the corresponding color-resist structure thereof are prepared by using the color-resist composition provided by the embodiments of the present disclosure.

Further, the inclination angle of the color-resist layer of the display panel in the overlapping region formed between two adjacent sub-pixels is set ranging from 40 degrees to 60 degrees, and the color-resist layer has a certain hardness, so as to avoid problems such as light leakage at the edge of the narrow frame tape of display panel, thus ensuring the overall performance of the display panel.

In the embodiments of the present disclosure, the color-resist composition and the corresponding display panel or display device using the same can be applied to any product or component with the display or touch function, such as a computer, an electronic paper, a monitor, a notebook computer, a digital photo frame, or the like. The specific type of the product or the component is not specifically limited here.

In view of foregoing, the color-resist composition and the display panel provided by the embodiments of the present disclosure are described in detail. In this paper, specific embodiments are adopted to illustrate a principle and implementation modes of the present disclosure. The description of the above-mentioned embodiments is only used to help understand methods and a core idea of the present disclosure. Meanwhile, for those skilled in the art, of the idea of the present disclosure, there will be changes in specific implementation modes and a scope of the present disclosure. In conclusion, contents of the specification should not be interpreted as a limitation of the present disclosure.

What is claimed is:

1. A color-resist composition, comprising:

a photocurable resin; and a photosensitive monomer;

wherein the photosensitive monomer is represented by the following chemical structure:

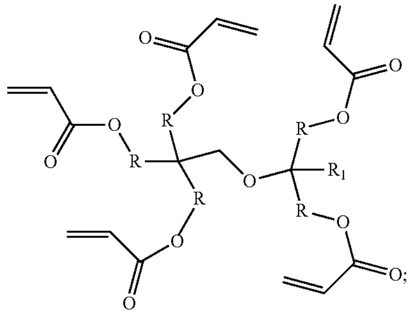

wherein R is an alkyl group containing any one of an ether group, —OH, and —COOH, and $R_1$ is selected from any one of —OH, —COOH, and an alkyl group containing any one of —OH and —COOH; wherein a relative molecular mass of the photosensitive monomer ranges from 500 to 1200, and the photosensitive monomer contains —COOH.

2. The color-resist composition of claim 1, wherein a ratio of a mass percentage of the photocurable resin to a mass percentage of the photosensitive monomer is set ranging from 0.3 to 0.7.

3. The color-resist composition of claim 1, wherein a relative molecular mass of the photocurable resin is set ranging from 8000 to 12000, and an acid value of the photocurable resin ranges from 80 to 120.

4. The color-resist composition of claim 3, wherein the photocurable resin comprises at least a first photocurable resin; and wherein the first photocurable resin is a photocurable resin containing a carbon-carbon double bond.

5. The color-resist composition of claim 4, wherein the photocurable resin further comprises a second photocurable resin, wherein the second photocurable resin has a structure represented by at least one of the following chemical structures:

(AA)

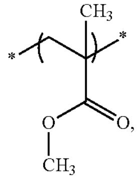

(AB)

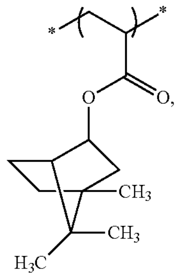

(AC)

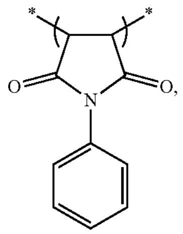

(AD)

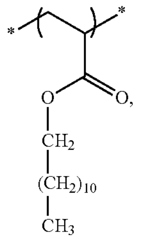

and (AF)

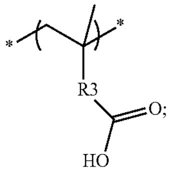

wherein the first photocurable resin has a structure represented by at least one of the following chemical structures:

(AE)

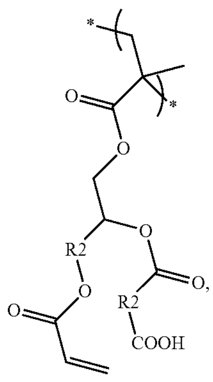

(AG)

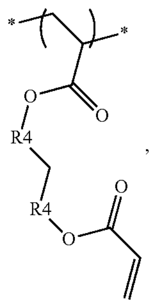

, (AH)

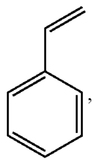

, (AI)

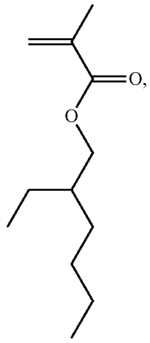

(AJ)

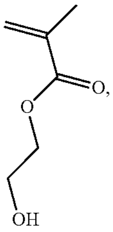

-continued (AK)

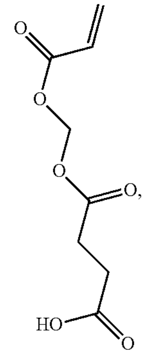

and (AL)

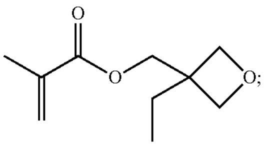

and wherein R2, R3, and R4 are carbon chains.

6. The color-resist composition of claim 5, wherein a content of the first photocurable resin is greater than a content of the second photocurable resin, calculated by a mass percentage of the first photocurable resin and a mass percentage of the second photocurable resin in the color-resist composition, respectively.

7. The color-resist composition of claim 5, wherein the photocurable resin is set as follows:

a combination of components of AE, AF, and AG, wherein the components and mass percentages thereof are correspondingly as follows: AE:AF:AG=25:45:30; or a combination of components of AH, AC, AI, AJ, AF, and AK, wherein the components and mass percentages thereof are correspondingly as follows: AH:AC:AI:AJ:AF:AK=10:15:40:15:10:10; or a combination of components of AH, AC, AI, AJ, AL, and AF, wherein the components and mass percentages thereof are correspondingly as follows: AH:AC:AI:AJ:AL:AF=10:15:20:15:25:15.

8. The color-resist composition of claim 1, wherein the photosensitive monomer contains a hydrophilic group.

9. A color-resist composition, comprising:

a photocurable resin; and a photosensitive monomer;

wherein the photosensitive monomer is represented by the following chemical structure:

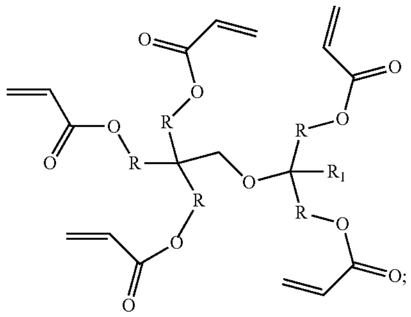

wherein R is an alkyl group containing any one of an ether group, —OH, and —COOH, $R_1$ is selected from any one of —OH, —COOH, and an alkyl group containing any one of —OH and —COOH.

10. The color-resist composition of claim 9, wherein a ratio of a mass percentage of the photocurable resin to a mass percentage of the photosensitive monomer is set ranging from 0.3 to 0.7.

11. The color-resist composition of claim 9, wherein a relative molecular mass of the photocurable resin is set ranging from 8000 to 12000, and an acid value of the photocurable resin ranges from 80 to 120.

12. The color-resist composition of claim 11, wherein the photocurable resin comprises at least a first photocurable resin; and wherein the first photocurable resin is a photocurable resin containing a carbon-carbon double bond.

13. The color-resist composition of claim 12, wherein the photocurable resin further comprises a second photocurable resin, wherein the second photocurable resin has a structure represented by at least one of the following chemical structures:

(AA)

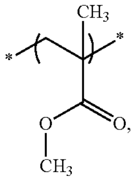

(AB)

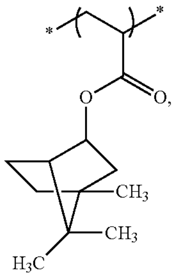

(AC)

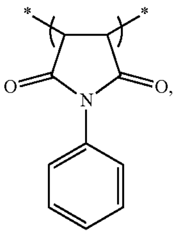

(AD)

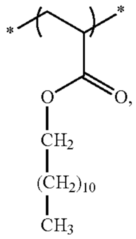

and

-continued (AF)

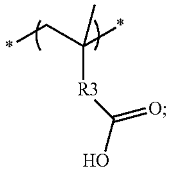

wherein the first photocurable resin has a structure represented by at least one of the following chemical structures:

(AE)

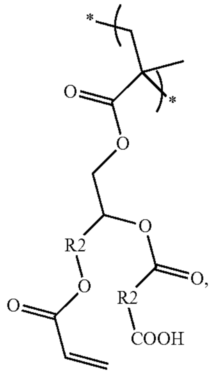

(AG)

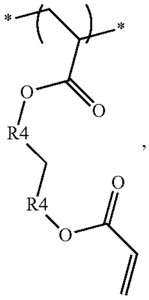

, (AH)

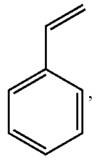

(AI)

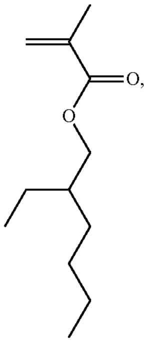

-continued (AJ)

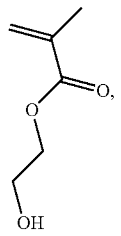

(AK)

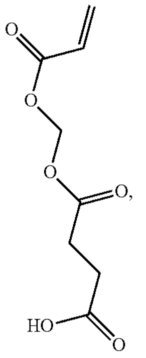

and (AL)

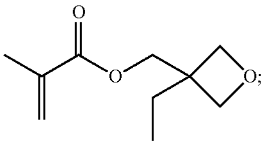

and wherein R2, R3, and R4 are carbon chains.

14. The color-resist composition of claim 13, wherein a content of the first photocurable resin is greater than a content of the second photocurable resin, calculated by a mass percentage of the first photocurable resin and a mass percentage of the second photocurable resin in the color-resist composition, respectively.

15. The color-resist composition of claim 13, wherein the photocurable resin is set as follows:

a combination of components of AE, AF, and AG, wherein the components and mass percentages thereof are correspondingly as follows: AE:AF:AG=25:45:30; or a combination of components of AH, AC, AI, AJ, AF, and AK, wherein the components and mass percentages thereof are correspondingly as follows: AH:AC:AI:AJ:AF:AK=10:15:40:15:10:10; or a combination of components of AH, AC, AI, AJ, AL, and AF, wherein the components and mass percentages thereof are correspondingly as follows: AH:AC:AI:AJ:AL:AF=10:15:20:15:25:15.

16. The color-resist composition of claim 9, wherein the photosensitive monomer contains a hydrophilic group, and the relative molecular mass of the photosensitive monomer is set ranging from 500 to 1200.

17. A display panel, comprising:

a liquid crystal layer; and a color-resist layer disposed on a light-emitting side of the liquid crystal layer;

wherein a material of the color-resist layer is prepared from a color-resist composition, and the color-resist composition comprises:

a photocurable resin; and a photosensitive monomer;

wherein the photosensitive monomer is represented by the following chemical structure:

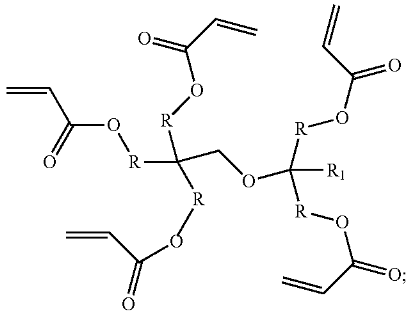

wherein R is an alkyl group containing any one of an ether group, —OH, and —COOH, and $R_1$ is selected from any one of —OH, —COOH, and an alkyl group containing any one of —OH and —COOH.

18. The display panel of claim 17, wherein the color-resist layer comprises a plurality of color-resist blocks, an inclination angle is formed between a side surface of each of the color-resist blocks and a substrate, and the inclination angle is set ranging from 40 degrees to 60 degrees.

19. The display panel of claim 17, wherein the photosensitive monomer contains a hydrophilic group, and a relative molecular mass of the photosensitive monomer is set ranging from 500 to 1200.

20. The display panel of claim 17, wherein a relative molecular mass of the photocurable resin is set ranging from 8000 to 12000, and an acid value of the photocurable resin ranges from 80 to 120.

* * * * *